(12) United States Patent
Fu

(10) Patent No.: US 11,435,451 B1
(45) Date of Patent: Sep. 6, 2022

(54) SIPM BASED SENSOR FOR LOW LEVEL FUSION

(71) Applicant: Motional AD LLC, Boston, MA (US)

(72) Inventor: Geng Fu, Belmont, MA (US)

(73) Assignee: Motional AD LLC, Boston, MA (US)

( * ) Notice: Subject to any disclaimer, the term of this patent is extended or adjusted under 35 U.S.C. 154(b) by 0 days.

(21) Appl. No.: 17/501,468

(22) Filed: Oct. 14, 2021

(51) Int. Cl.
| | |
|---|---|
| G01S 17/931 | (2020.01) |
| G01S 7/4863 | (2020.01) |
| G01S 17/894 | (2020.01) |
| G06T 3/40 | (2006.01) |
| G01S 17/08 | (2006.01) |
| G01S 17/48 | (2006.01) |

(52) U.S. Cl.
CPC ............ *G01S 7/4863* (2013.01); *G01S 17/08* (2013.01); *G01S 17/48* (2013.01); *G01S 17/894* (2020.01); *G01S 17/931* (2020.01); *G06T 3/4038* (2013.01); *H01L 2924/12043* (2013.01)

(58) Field of Classification Search
None
See application file for complete search history.

(56) References Cited

U.S. PATENT DOCUMENTS

| | | |
|---|---|---|
| 9,271,694 B2 | 3/2016 | Kim et al. |
| 9,658,158 B2 | 5/2017 | Renna et al. |
| 10,901,074 B1 | 1/2021 | Pan et al. |
| 2011/0147567 A1 | 6/2011 | Grazioso et al. |
| 2012/0068050 A1 | 3/2012 | Mazzillo et al. |
| 2015/0168567 A1 | 6/2015 | Kim et al. |
| 2018/0102442 A1 | 4/2018 | Wang et al. |
| 2018/0164416 A1 | 6/2018 | Ekengren |
| 2018/0259625 A1 | 9/2018 | Gnecchi et al. |
| 2019/0082128 A1 | 3/2019 | Oh |
| 2019/0182415 A1* | 6/2019 | Sivan ...................... G06F 1/163 |
| 2019/0288132 A1 | 9/2019 | Wang et al. |
| 2020/0075652 A1* | 3/2020 | Chen ................ H01L 27/14645 |
| 2020/0110159 A1 | 4/2020 | Wohlgenannt et al. |
| 2020/0116559 A1 | 4/2020 | Pacala et al. |
| 2021/0109199 A1 | 4/2021 | Hennecke et al. |
| 2021/0278257 A1* | 9/2021 | Dharia .................. G01S 13/865 |
| 2021/0293931 A1 | 9/2021 | Nemet et al. |

(Continued)

FOREIGN PATENT DOCUMENTS

| | | |
|---|---|---|
| KR | 101936193 | 1/2019 |
| WO | WO 2006/073875 | 7/2006 |

(Continued)

OTHER PUBLICATIONS

Acerbi et al., "Understanding and simulating SiPMs," Nuclear Instruments and Methods in Physics Research Section A: Accelerators, Spectrometers, Detectors and Associated Equipment, May 11, 2019, 926:16-35.

(Continued)

*Primary Examiner* — Eileen M Adams
(74) *Attorney, Agent, or Firm* — Fish & Richardson P.C.

(57) ABSTRACT

Provided are methods for Silicon Photomultiplier (SiPM)-based sensor for low-level fusion, which can include mitigating a Light Detection and Ranging (LiDAR) sensor processing path to provide high-confidence, low-level fusion between the camera (passive) and LiDAR (active) imaging. Systems and computer program products are also provided.

21 Claims, 8 Drawing Sheets

(56) References Cited

U.S. PATENT DOCUMENTS

2021/0325541 A1* 10/2021 Kim .................... G06T 7/20
2021/0389467 A1    12/2021 Eshel et al.

FOREIGN PATENT DOCUMENTS

WO    WO 2018/162632    9/2018
WO    WO 2020/033749    2/2020

OTHER PUBLICATIONS

Dolinsky et al., "Timing resolution performance comparison for fast and standard outputs of SensL SiPM," 2013 IEEE Nuclear Science Symposium and Medical Imaging Conference, Oct. 27, 2013, 6 pages.

Agishev et al., "Lidar with SiPM: Some capabilities and limitations in real environment," Optics & Laser Technology, Jul. 1, 2013, 49:86-90.

Gnecchi et al., "A 1×16 SiPM array for automotive 3D imaging LiDAR systems," Proceedings of the 2017 International Image Sensor Workshop (IISW), Hiroshima, Japan, May 30, 2017, 133-36.

Villa et al., "SPADs and SiPMs Arrays for Long-Range High-Speed Light Detection and Ranging (LiDAR)," Sensors, Jan. 21, 2021, 21(11):3839.

Gnecchi et al., "Long Distance Ranging Performance of Gen3 LiDAR Imaging System based on 1×16 SiPM Array," Proceedings of the International Image Sensors Society (IISS) Workshop, Snowbird, UT, USA, Jun. 2019, 23-7.

\* cited by examiner

SIPM BASED SENSOR FOR LOW LEVEL FUSION

BACKGROUND

Light Detection and Ranging (LiDAR) determines information from light emitted by an emitter, reflected by an object, and detected by a detector. The information includes data associated with the object, such as a range to the object, velocity of the object, and the like. The detector is a photodetector that receives the light reflected by the object. The detector can be a solid state photodetector, a photomultiplier, or any combinations thereof.

DETAILED DESCRIPTION

Figure 1:
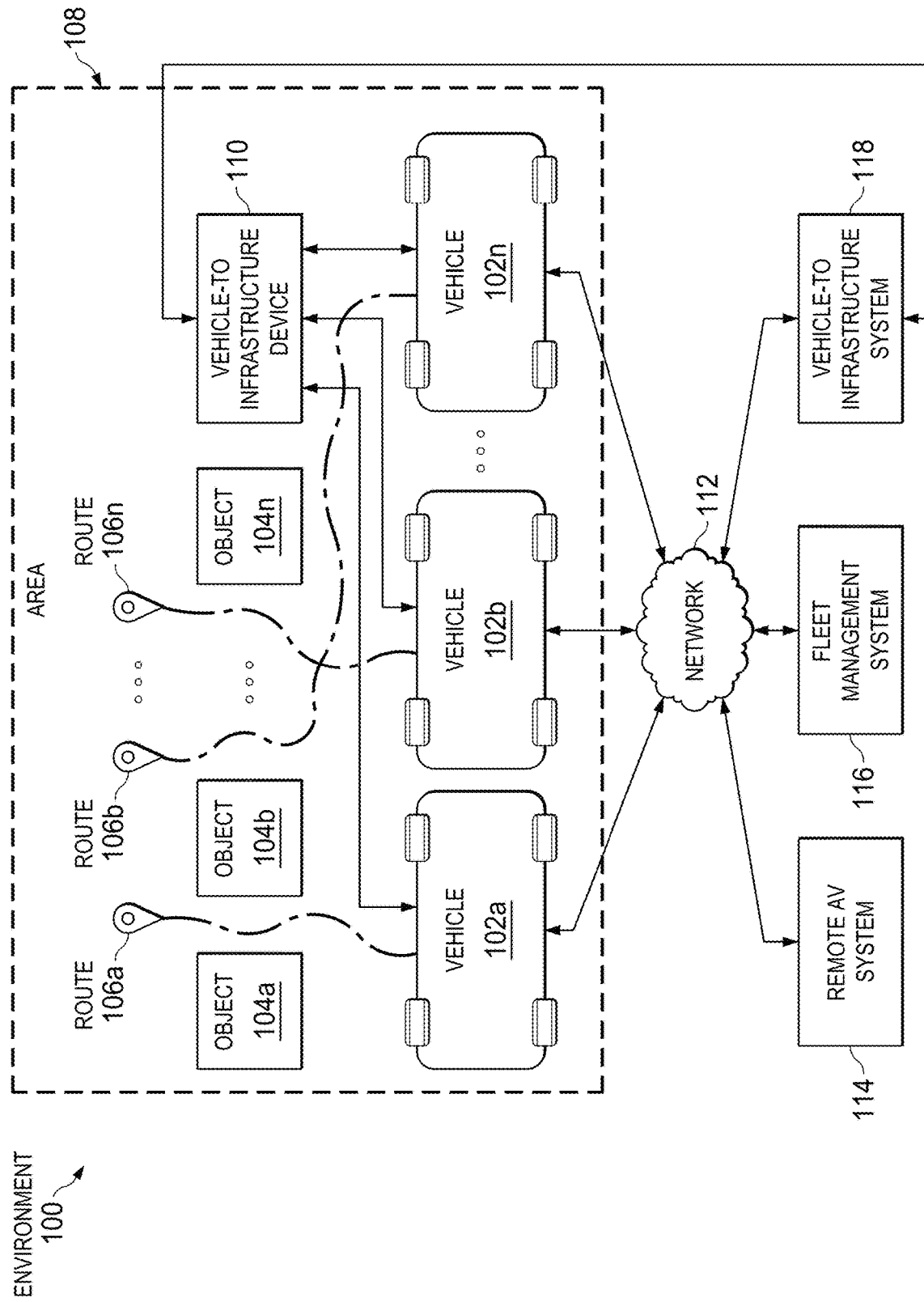
FIG. 1 is an example environment in which a vehicle including one or more components of an autonomous system can be implemented.

In the following description numerous specific details are set forth in order to provide a thorough understanding of the present disclosure for the purposes of explanation. It will be apparent, however, that the embodiments described by the present disclosure can be practiced without these specific details. In some instances, well-known structures and devices are illustrated in block diagram form in order to avoid unnecessarily obscuring aspects of the present disclosure.

Specific arrangements or orderings of schematic elements, such as those representing systems, devices, modules, instruction blocks, data elements, and/or the like are illustrated in the drawings for ease of description. However, it will be understood by those skilled in the art that the specific ordering or arrangement of the schematic elements in the drawings is not meant to imply that a particular order or sequence of processing, or separation of processes, is required unless explicitly described as such. Further, the inclusion of a schematic element in a drawing is not meant to imply that such element is required in all embodiments or that the features represented by such element may not be included in or combined with other elements in some embodiments unless explicitly described as such.

Further, where connecting elements such as solid or dashed lines or arrows are used in the drawings to illustrate a connection, relationship, or association between or among two or more other schematic elements, the absence of any such connecting elements is not meant to imply that no connection, relationship, or association can exist. In other words, some connections, relationships, or associations between elements are not illustrated in the drawings so as not to obscure the disclosure. In addition, for ease of illustration, a single connecting element can be used to represent multiple connections, relationships or associations between elements. For example, where a connecting element represents communication of signals, data, or instructions (e.g., "software instructions"), it should be understood by those skilled in the art that such element can represent one or multiple signal paths (e.g., a bus), as may be needed, to affect the communication.

Although the terms first, second, third, and/or the like are used to describe various elements, these elements should not be limited by these terms. The terms first, second, third, and/or the like are used only to distinguish one element from another. For example, a first contact could be termed a second contact and, similarly, a second contact could be termed a first contact without departing from the scope of the described embodiments. The first contact and the second contact are both contacts, but they are not the same contact.

The terminology used in the description of the various described embodiments herein is included for the purpose of describing particular embodiments only and is not intended to be limiting. As used in the description of the various described embodiments and the appended claims, the singular forms "a," "an" and "the" are intended to include the plural forms as well and can be used interchangeably with "one or more" or "at least one," unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this description specify the presence of stated features, integers, steps, operations, elements, and/or components, but do not preclude the presence or addition of one or more other features, integers, steps, operations, elements, components, and/or groups thereof.

As used herein, the terms "communication" and "communicate" refer to at least one of the reception, receipt, transmission, transfer, provision, and/or the like of information (or information represented by, for example, data, signals, messages, instructions, commands, and/or the like). For one unit (e.g., a device, a system, a component of a device or system, combinations thereof, and/or the like) to be in communication with another unit means that the one unit is able to directly or indirectly receive information from and/or send (e.g., transmit) information to the other unit. This may refer to a direct or indirect connection that is wired and/or wireless in nature. Additionally, two units may be in communication with each other even though the information transmitted may be modified, processed, relayed, and/or routed between the first and second unit. For example, a first unit may be in communication with a second unit even though the first unit passively receives information and does not actively transmit information to the second unit. As another example, a first unit may be in communication with a second unit if at least one intermediary unit (e.g., a third unit located between the first unit and the second unit) processes information received from the first unit and transmits the processed information to the second unit. In some embodiments, a message may refer to a network packet (e.g., a data packet and/or the like) that includes data.

As used herein, the term "if" is, optionally, construed to mean "when", "upon", "in response to determining," "in response to detecting," and/or the like, depending on the context. Similarly, the phrase "if it is determined" or "if [a stated condition or event] is detected" is, optionally, construed to mean "upon determining," "in response to determining," "upon detecting [the stated condition or event]," "in response to detecting [the stated condition or event]," and/or the like, depending on the context. Also, as used herein, the terms "has", "have", "having", or the like are intended to be open-ended terms. Further, the phrase "based on" is intended to mean "based at least partially on" unless explicitly stated otherwise.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments can be practiced without these specific details. In other instances, well-known methods, procedures, components, circuits, and networks have not been described in detail so as not to unnecessarily obscure aspects of the embodiments.

General Overview

In some aspects and/or embodiments, systems, methods, and computer program products described herein include and/or implement a silicon photomultiplier (SiPM)-based sensor for low-level fusion. In some embodiments, the SiPM-based sensor with low-level fusion can be part of a Light Detection and Ranging (LiDAR) device. Generally, low-level fusion refers to determining correspondences between different types of sensor data on a per pixel basis. An SiPM-based sensor can be configured as a single pixel sensor or an array of pixels that are operable to capture light reflected by objects in the environment. Each SiPM pixel is realized using one or more microcells. In an embodiment, the SiPM pixel can be composed of sub-pixels of different types. In an embodiment, a photodiode (PD) type sub-pixel is used in each or some of SiPM pixels. In an embodiment, different color filters (e.g., red/green/blue (RGB)) are applied to each sub-pixel. In an embodiment, the RGB filters are arranged to capture their respective color data. In an embodiment, specific deep trench and subpixel patterns are used. An optical trench is used to reduce crosstalk between sub-pixels of the SiPM.

Automotive time-of-flight (ToF) Light Detection and Ranging (LiDAR) systems use laser signals to determine the speed and distance of stationary and moving objects (e.g., other vehicles, pedestrians, obstacles). LiDAR systems compare emitted transmit signals to reflected return signals to make these measurements. For many applications, it is desirable to provide a long-range detection capability. In general, an SiPM-based time-of-flight (TOF) LiDAR provides a long detection range with high pixel throughput. In some examples, an SiPM-based LiDAR enables high-sensitivity for low-light flux when compared with avalanche photo-diode (APD)-based LiDAR, which can provide longer range detection capabilities. However, the point cloud coordination accuracy of the SiPM-based LiDAR is limited by the position repeatability of a scanning system, which fundamentally limits the accuracy of the camera and LiDAR low-level (early) fusion. Low-level fusion is about fusing LiDAR and camera raw data at pixel (or image) level. For example, the LiDAR point clouds (e.g., three-dimensional (3D)) are projected onto a two-dimensional (2D) camera image, and then a check is performed whether or not the point clouds belong to the object (2D) bounding boxes. By virtue of the implementation of systems, methods, and computer program products described herein, techniques for an SiPM-based sensor for low-level fusion while providing a high dynamic range (DR) sensor output that provides accurate return signal intensity and object reflectivity information in LiDAR applications. Data output by the SiPM-based sensor enables the determination of intensity in the presence of sensor saturation. Thus, the present techniques improve the function of the LiDAR sensor and a vehicle including the LiDAR sensor. These and other embodiments can also mitigate a LiDAR sensor processing path to provide high-confidence, low-level fusion between the camera (passive) and LiDAR (active) imaging. Passive imaging, for example, refers to measuring reflected light (e.g.; sunlight emitted from the sun) that is not introduced by imaging or sensing equipment. Active imaging, for example, uses an introduced source of light or illumination, e.g., actively sending a pulse and measuring backscattered or reflected light. These and other embodiments can provide a cost-effective solution for low-level camera and LiDAR fusion and a simplified calibration procedure for multiple-type sensor fusion.

Referring now to FIG. 1, illustrated is example environment 100 in which vehicles that include autonomous systems, as well as vehicles that do not, are operated. As illustrated, environment 100 includes vehicles 102a-102n, objects 104a-104n, routes 106a-106n, area 108, vehicle-to-infrastructure (V2I) device 110, network 112, remote autonomous vehicle (AV) system 114, fleet management system 116, and V2I system 118. Vehicles 102a-102n, vehicle-to-infrastructure (V2I) device 110, network 112, autonomous vehicle (AV) system 114, fleet management system 116, and V2I system 118 interconnect (e.g., establish a connection to communicate and/or the like) via wired connections, wireless connections, or a combination of wired or wireless connections. In some embodiments, objects 104a-104n interconnect with at least one of vehicles 102a-102n, vehicle-to-infrastructure (V2I) device 110, network 112, autonomous vehicle (AV) system 114, fleet management system 116, and V2I system 118 via wired connections, wireless connections, or a combination of wired or wireless connections.

Vehicles 102a-102n (referred to individually as vehicle 102 and collectively as vehicles 102) include at least one device configured to transport goods and/or people. In some embodiments, vehicles 102 are configured to be in communication with V2I device 110, remote AV system 114, fleet management system 116, and/or V2I system 118 via network 112. In some embodiments, vehicles 102 include cars, buses, trucks, trains, and/or the like. In some embodiments, vehicles 102 are the same as, or similar to, vehicles 200, described herein (see FIG. 2). In some embodiments, a vehicle 200 of a set of vehicles 200 is associated with an autonomous fleet manager. In some embodiments, vehicles 102 travel along respective routes 106a-106n (referred to individually as route 106 and collectively as routes 106), as described herein. In some embodiments, one or more vehicles 102 include an autonomous system (e.g., an autonomous system that is the same as or similar to autonomous system 202).

Objects 104a-104n (referred to individually as object 104 and collectively as objects 104) include, for example, at least one vehicle, at least one pedestrian, at least one cyclist, at least one structure (e.g., a building, a sign, a fire hydrant, etc.), and/or the like. Each object 104 is stationary (e.g., located at a fixed location for a period of time) or mobile (e.g., having a velocity and associated with at least one trajectory). In some embodiments, objects 104 are associated with corresponding locations in area 108.

Routes 106a-106n (referred to individually as route 106 and collectively as routes 106) are each associated with (e.g., prescribe) a sequence of actions (also known as a trajectory) connecting states along which an AV can navigate. Each route 106 starts at an initial state (e.g., a state that corresponds to a first spatiotemporal location, velocity, and/or the like) and a final goal state (e.g., a state that corresponds to a second spatiotemporal location that is different from the first spatiotemporal location) or goal region (e.g., a subspace of acceptable states (e.g., terminal states)). In some embodiments, the first state includes a location at which an individual or individuals are to be picked-up by the AV and the second state or region includes a location or locations at which the individual or individuals picked-up by the AV are to be dropped-off. In some embodiments, routes 106 include a plurality of acceptable state sequences (e.g., a plurality of spatiotemporal location sequences), the plurality of state sequences associated with (e.g., defining) a plurality of trajectories. In an example, routes 106 include only high level actions or imprecise state locations, such as a series of connected roads dictating turning directions at roadway intersections. Additionally, or alternatively, routes 106 may include more precise actions or states such as, for example, specific target lanes or precise locations within the lane areas and targeted speed at those positions. In an example, routes 106 include a plurality of precise state sequences along the at least one high level action sequence with a limited look ahead horizon to reach intermediate goals, where the combination of successive iterations of limited horizon state sequences cumulatively correspond to a plurality of trajectories that collectively form the high level route to terminate at the final goal state or region.

Area 108 includes a physical area (e.g., a geographic region) within which vehicles 102 can navigate. In an example, area 108 includes at least one state (e.g., a country, a province, an individual state of a plurality of states included in a country, etc.), at least one portion of a state, at least one city, at least one portion of a city, etc. In some embodiments, area 108 includes at least one named thoroughfare (referred to herein as a "road") such as a highway, an interstate highway, a parkway, a city street, etc. Additionally, or alternatively, in some examples area 108 includes at least one unnamed road such as a driveway, a section of a parking lot, a section of a vacant and/or undeveloped lot, a dirt path, etc. In some embodiments, a road includes at least one lane (e.g., a portion of the road that can be traversed by vehicles 102). In an example, a road includes at least one lane associated with (e.g., identified based on) at least one lane marking.

Vehicle-to-Infrastructure (V2I) device 110 (sometimes referred to as a Vehicle-to-Infrastructure (V2X) device) includes at least one device configured to be in communication with vehicles 102 and/or V2I infrastructure system 118. In some embodiments, V2I device 110 is configured to be in communication with vehicles 102, remote AV system 114, fleet management system 116, and/or V2I system 118 via network 112. In some embodiments, V2I device 110 includes a radio frequency identification (RFID) device, signage, cameras (e.g., two-dimensional (2D) and/or three-dimensional (3D) cameras), lane markers, streetlights, parking meters, etc. In some embodiments, V2I device 110 is configured to communicate directly with vehicles 102. Additionally, or alternatively, in some embodiments V2I device 110 is configured to communicate with vehicles 102, remote AV system 114, and/or fleet management system 116 via V2I system 118. In some embodiments, V2I device 110 is configured to communicate with V2I system 118 via network 112.

Network 112 includes one or more wired and/or wireless networks. In an example, network 112 includes a cellular network (e.g., a long term evolution (LTE) network, a third generation (3G) network, a fourth generation (4G) network, a fifth generation (5G) network, a code division multiple access (CDMA) network, etc.), a public land mobile network (PLMN), a local area network (LAN), a wide area network (WAN), a metropolitan area network (MAN), a telephone network (e.g., the public switched telephone network (PSTN), a private network, an ad hoc network, an intranet, the Internet, a fiber optic-based network, a cloud computing network, etc., a combination of some or all of these networks, and/or the like.

Remote AV system 114 includes at least one device configured to be in communication with vehicles 102, V2I device 110, network 112, remote AV system 114, fleet management system 116, and/or V2I system 118 via network 112. In an example, remote AV system 114 includes a server, a group of servers, and/or other like devices. In some embodiments, remote AV system 114 is co-located with the fleet management system 116. In some embodiments, remote AV system 114 is involved in the installation of some or all of the components of a vehicle, including an autonomous system, an autonomous vehicle compute, software implemented by an autonomous vehicle compute, and/or the like. In some embodiments, remote AV system 114 maintains (e.g., updates and/or replaces) such components and/or software during the lifetime of the vehicle.

Fleet management system 116 includes at least one device configured to be in communication with vehicles 102, V2I device 110, remote AV system 114, and/or V2I infrastructure system 118. In an example, fleet management system 116 includes a server, a group of servers, and/or other like devices. In some embodiments, fleet management system 116 is associated with a ridesharing company (e.g., an organization that controls operation of multiple vehicles (e.g., vehicles that include autonomous systems and/or vehicles that do not include autonomous systems) and/or the like).

In some embodiments, V2I system 118 includes at least one device configured to be in communication with vehicles 102, V2I device 110, remote AV system 114, and/or fleet management system 116 via network 112. In some examples, V2I system 118 is configured to be in communication with V2I device 110 via a connection different from network 112. In some embodiments, V2I system 118 includes a server, a group of servers, and/or other like devices. In some embodiments, V2I system 118 is associated with a municipality or a private institution (e.g., a private institution that maintains V2I device 110 and/or the like).

The number and arrangement of elements illustrated in FIG. 1 are provided as an example. There can be additional elements, fewer elements, different elements, and/or differently arranged elements, than those illustrated in FIG. 1. Additionally, or alternatively, at least one element of environment 100 can perform one or more functions described as being performed by at least one different element of FIG. 1. Additionally, or alternatively, at least one set of elements of environment 100 can perform one or more functions described as being performed by at least one different set of elements of environment 100.

Figure 2:
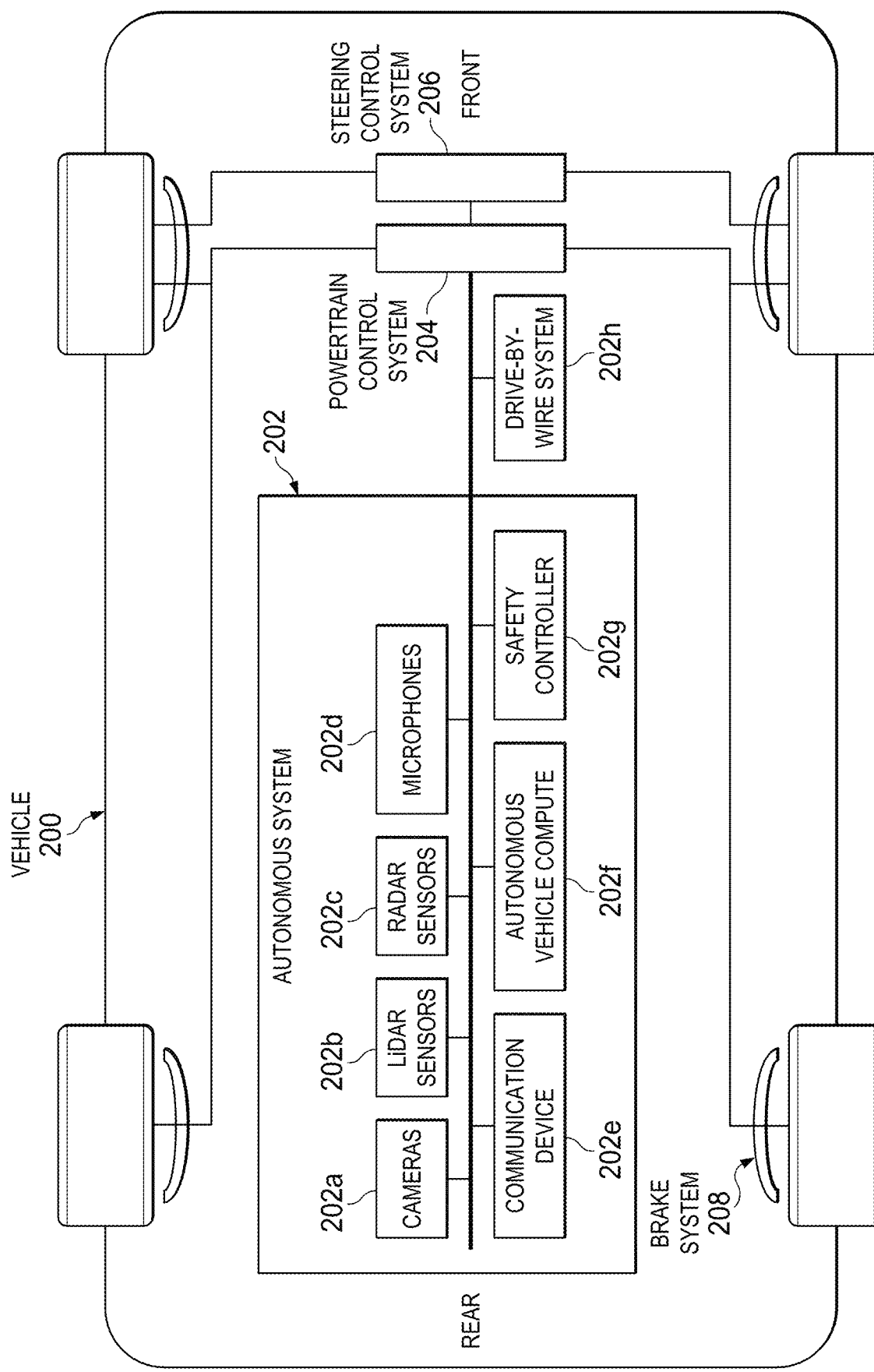
FIG. 2 is a diagram of one or more systems of a vehicle including an autonomous system.

Referring now to FIG. 2, vehicle 200 includes autonomous system 202, powertrain control system 204, steering control system 206, and brake system 208. In some embodiments, vehicle 200 is the same as or similar to vehicle 102 (see FIG. 1). In some embodiments, vehicle 102 have autonomous capability (e.g., implement at least one function, feature, device, and/or the like that enable vehicle 200 to be partially or fully operated without human intervention including, without limitation, fully autonomous vehicles (e.g., vehicles that forego reliance on human intervention), highly autonomous vehicles (e.g., vehicles that forego reliance on human intervention in certain situations), and/or the like). For a detailed description of fully autonomous vehicles and highly autonomous vehicles, reference may be made to SAE International's standard J3016: Taxonomy and Definitions for Terms Related to On-Road Motor Vehicle Automated Driving Systems, which is incorporated by reference in its entirety. In some embodiments, vehicle 200 is associated with an autonomous fleet manager and/or a ridesharing company.

Autonomous system 202 includes a sensor suite that includes one or more devices such as cameras 202a, LiDAR sensors 202b, radar sensors 202c, and microphones 202d. In some embodiments, autonomous system 202 can include more or fewer devices and/or different devices (e.g., ultrasonic sensors, inertial sensors, GPS receivers (discussed below), odometry sensors that generate data associated with an indication of a distance that vehicle 200 has traveled, and/or the like). In some embodiments, autonomous system 202 uses the one or more devices included in autonomous system 202 to generate data associated with environment 100, described herein. The data generated by the one or more devices of autonomous system 202 can be used by one or more systems described herein to observe the environment (e.g., environment 100) in which vehicle 200 is located. In some embodiments, autonomous system 202 includes communication device 202e, autonomous vehicle compute 202f, and drive-by-wire (DBW) system 202h.

Figure 3:
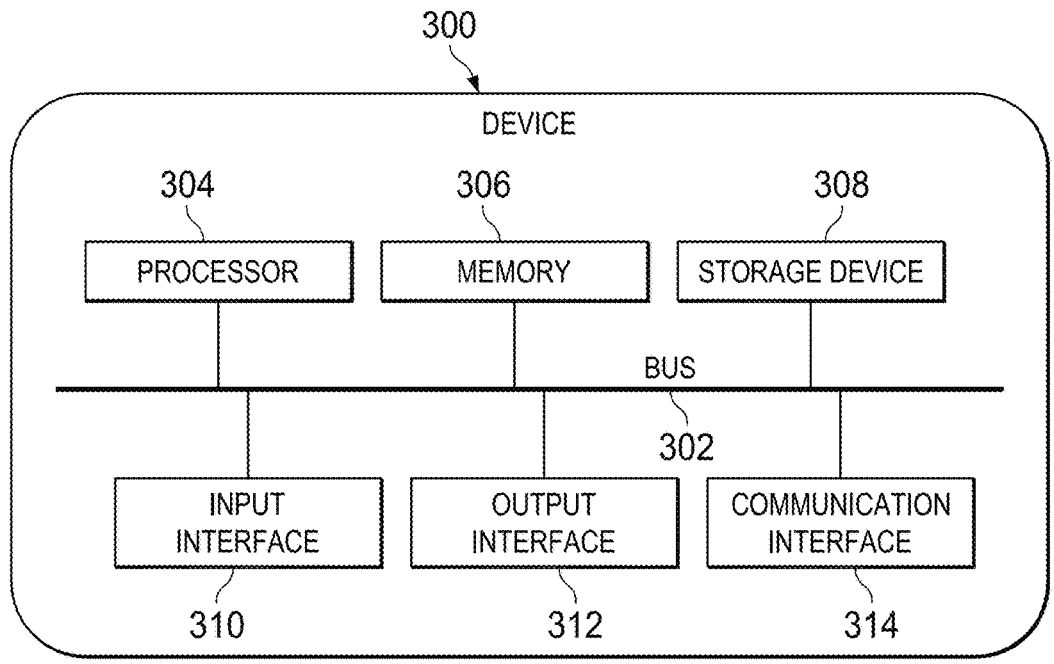
FIG. 3 is a diagram of components of one or more devices and/or one or more systems of FIGS. 1 and 2.

Cameras 202a include at least one device configured to be in communication with communication device 202e, autonomous vehicle compute 202f, and/or safety controller 202g via a bus (e.g., a bus that is the same as or similar to bus 302 of FIG. 3). Cameras 202a include at least one camera (e.g., a digital camera using a light sensor such as a charge-coupled device (CCD), a complementary-metal-oxide-semiconductor (CMOS) image sensor (CIS), a thermal camera, an infrared (IR) camera, an event camera, and/or the like) to capture images including physical objects (e.g., cars, buses, curbs, people, and/or the like). In some embodiments, camera 202a generates camera data as output. In some examples, camera 202a generates camera data that includes image data associated with an image. In this example, the image data may specify at least one parameter (e.g., image characteristics such as exposure, brightness, etc., an image timestamp, and/or the like) corresponding to the image. In such an example, the image may be in a format (e.g., RAW, JPEG, PNG, and/or the like). In some embodiments, camera 202a includes a plurality of independent cameras configured on (e.g., positioned on) a vehicle to capture images for the purpose of stereopsis (stereo vision). In some examples, camera 202a includes a plurality of cameras that generate image data and transmit the image data to autonomous vehicle compute 202f and/or a fleet management system (e.g., a fleet management system that is the same as or similar to fleet management system 116 of FIG. 1). In such an example, autonomous vehicle compute 202f determines depth to one or more objects in a field of view of at least two cameras of the plurality of cameras based on the image data from the at least two cameras. In some embodiments, cameras 202a is configured to capture images of objects within a distance from cameras 202a (e.g., up to 100 meters, up to a kilometer, and/or the like). Accordingly, cameras 202a include features such as sensors and lenses that are optimized for perceiving objects that are at one or more distances from cameras 202a.

In an embodiment, camera 202a includes at least one camera configured to capture one or more images associated with one or more traffic lights, street signs and/or other physical objects that provide visual navigation information. In some embodiments, camera 202a generates traffic light data associated with one or more images. In some examples, camera 202a generates TLD data associated with one or more images that include a format (e.g., RAW, JPEG, PNG, and/or the like). In some embodiments, camera 202a that generates TLD data differs from other systems described herein incorporating cameras in that camera 202a can include one or more cameras with a wide field of view (e.g., a wide-angle lens, a fish-eye lens, a lens having a viewing angle of approximately 120 degrees or more, and/or the like) to generate images about as many physical objects as possible.

Light Detection and Ranging (LiDAR) sensors 202b include at least one device configured to be in communication with communication device 202e, autonomous vehicle compute 202f, and/or safety controller 202g via a bus (e.g., a bus that is the same as or similar to bus 302 of FIG. 3). The LiDAR sensors 202b may be an SiPM-based LiDAR. LiDAR sensors 202b include a system configured to transmit light from a light emitter (e.g., a laser transmitter). Light emitted by LiDAR sensors 202b include light (e.g., infrared light and/or the like) that is outside of the visible spectrum. In some embodiments, during operation, light emitted by LiDAR sensors 202b encounters a physical object (e.g., a vehicle) and is reflected back to LiDAR sensors 202b. In some embodiments, the light emitted by LiDAR sensors 202b does not penetrate the physical objects that the light encounters. LiDAR sensors 202b also include at least one light detector which detects the light that was emitted from the light emitter after the light encounters a physical object. In some embodiments, at least one data processing system associated with LiDAR sensors 202b generates an image (e.g., a point cloud, a combined point cloud, and/or the like) representing the objects included in a field of view of LiDAR sensors 202b. In some examples, the at least one data processing system associated with LiDAR sensor 202b generates an image that represents the boundaries of a physical object, the surfaces (e.g., the topology of the surfaces) of the physical object, and/or the like. In such an example, the image is used to determine the boundaries of physical objects in the field of view of LiDAR sensors 202b.

Radio Detection and Ranging (radar) sensors 202c include at least one device configured to be in communication with communication device 202e, autonomous vehicle compute 202f, and/or safety controller 202g via a bus (e.g., a bus that is the same as or similar to bus 302 of FIG. 3). Radar sensors 202c include a system configured to transmit radio waves (either pulsed or continuously). The radio waves transmitted by radar sensors 202c include radio waves that are within a predetermined spectrum. In some embodiments, during operation, radio waves transmitted by radar sensors 202c encounter a physical object and are reflected back to radar sensors 202c. In some embodiments, the radio waves transmitted by radar sensors 202c are not reflected by some objects. In some embodiments, at least one data processing system associated with radar sensors 202c generates signals representing the objects included in a field of view of radar sensors 202c. For example, the at least one data processing system associated with radar sensor 202c generates an image that represents the boundaries of a physical object, the surfaces (e.g., the topology of the surfaces) of the physical object, and/or the like. In some examples, the image is used to determine the boundaries of physical objects in the field of view of radar sensors 202c.

Microphones 202d include at least one device configured to be in communication with communication device 202e, autonomous vehicle compute 202f, and/or safety controller 202g via a bus (e.g., a bus that is the same as or similar to bus 302 of FIG. 3). Microphones 202d include one or more microphones (e.g., array microphones, external microphones, and/or the like) that capture audio signals and generate data associated with (e.g., representing) the audio signals. In some examples, microphones 202d include transducer devices and/or like devices. In some embodiments, one or more systems described herein can receive the data generated by microphones 202d and determine a position of an object relative to vehicle 200 (e.g., a distance and/or the like) based on the audio signals associated with the data.

Communication device 202e include at least one device configured to be in communication with cameras 202a, LiDAR sensors 202b, radar sensors 202c, microphones 202d, autonomous vehicle compute 202f, safety controller 202g, and/or DBW system 202h. For example, communication device 202e may include a device that is the same as or similar to communication interface 314 of FIG. 3. In some embodiments, communication device 202e includes a vehicle-to-vehicle (V2V) communication device (e.g., a device that enables wireless communication of data between vehicles).

Autonomous vehicle compute 202f include at least one device configured to be in communication with cameras 202a, LiDAR sensors 202b, radar sensors 202c, microphones 202d, communication device 202e, safety controller 202g, and/or DBW system 202h. In some examples, autonomous vehicle compute 202f includes a device such as a client device, a mobile device (e.g., a cellular telephone, a tablet, and/or the like) a server (e.g., a computing device including one or more central processing units, graphical processing units, and/or the like), and/or the like. In some embodiments, autonomous vehicle compute 202f is the same as or similar to autonomous vehicle compute 400, described herein. Additionally, or alternatively, in some embodiments autonomous vehicle compute 202f is configured to be in communication with an autonomous vehicle system (e.g., an autonomous vehicle system that is the same as or similar to remote AV system 114 of FIG. 1), a fleet management system (e.g., a fleet management system that is the same as or similar to fleet management system 116 of FIG. 1), a V2I device (e.g., a V2I device that is the same as or similar to V2I device 110 of FIG. 1), and/or a V2I system (e.g., a V2I system that is the same as or similar to V2I system 118 of FIG. 1).

Safety controller 202g includes at least one device configured to be in communication with cameras 202a, LiDAR sensors 202b, radar sensors 202c, microphones 202d, communication device 202e, autonomous vehicle computer 202f, and/or DBW system 202h. In some examples, safety controller 202g includes one or more controllers (electrical controllers, electromechanical controllers, and/or the like) that are configured to generate and/or transmit control signals to operate one or more devices of vehicle 200 (e.g., powertrain control system 204, steering control system 206, brake system 208, and/or the like). In some embodiments, safety controller 202g is configured to generate control signals that take precedence over (e.g., overrides) control signals generated and/or transmitted by autonomous vehicle compute 202f.

DBW system 202h includes at least one device configured to be in communication with communication device 202e and/or autonomous vehicle compute 202f. In some examples, DBW system 202h includes one or more controllers (e.g., electrical controllers, electromechanical controllers, and/or the like) that are configured to generate and/or transmit control signals to operate one or more devices of vehicle 200 (e.g., powertrain control system 204, steering control system 206, brake system 208, and/or the like). Additionally, or alternatively, the one or more controllers of DBW system 202h are configured to generate and/or transmit control signals to operate at least one different device (e.g., a turn signal, headlights, door locks, windshield wipers, and/or the like) of vehicle 200.

Powertrain control system 204 includes at least one device configured to be in communication with DBW system 202h. In some examples, powertrain control system 204 includes at least one controller, actuator, and/or the like. In some embodiments, powertrain control system 204 receives control signals from DBW system 202h and powertrain control system 204 causes vehicle 200 to start moving forward, stop moving forward, start moving backward, stop moving backward, accelerate in a direction, decelerate in a direction, perform a left turn, perform a right turn, and/or the like. In an example, powertrain control system 204 causes the energy (e.g., fuel, electricity, and/or the like) provided to a motor of the vehicle to increase, remain the same, or decrease, thereby causing at least one wheel of vehicle 200 to rotate or not rotate.

Steering control system 206 includes at least one device configured to rotate one or more wheels of vehicle 200. In some examples, steering control system 206 includes at least one controller, actuator, and/or the like. In some embodiments, steering control system 206 causes the front two wheels and/or the rear two wheels of vehicle 200 to rotate to the left or right to cause vehicle 200 to turn to the left or right.

Brake system 208 includes at least one device configured to actuate one or more brakes to cause vehicle 200 to reduce speed and/or remain stationary. In some examples, brake system 208 includes at least one controller and/or actuator that is configured to cause one or more calipers associated with one or more wheels of vehicle 200 to close on a corresponding rotor of vehicle 200. Additionally, or alternatively, in some examples brake system 208 includes an automatic emergency braking (AEB) system, a regenerative braking system, and/or the like.

In some embodiments, vehicle 200 includes at least one platform sensor (not explicitly illustrated) that measures or infers properties of a state or a condition of vehicle 200. In some examples, vehicle 200 includes platform sensors such as a global positioning system (GPS) receiver, an inertial measurement unit (IMU), a wheel speed sensor, a wheel brake pressure sensor, a wheel torque sensor, an engine torque sensor, a steering angle sensor, and/or the like.

Referring now to FIG. 3, illustrated is a schematic diagram of a device 300. As illustrated, device 300 includes processor 304, memory 306, storage component 308, input interface 310, output interface 312, communication interface 314, and bus 302. In some embodiments, device 300 corresponds to at least one device of vehicles 102 (e.g., at least one device of a system of vehicles 102), and/or one or more devices of network 112 (e.g., one or more devices of a system of network 112). In some embodiments, one or more devices of vehicles 102 (e.g., one or more devices of a system of vehicles 102), and/or one or more devices of network 112 (e.g., one or more devices of a system of network 112) include at least one device 300 and/or at least one component of device 300. As shown in FIG. 3, device 300 includes bus 302, processor 304, memory 306, storage component 308, input interface 310, output interface 312, and communication interface 314.

Bus 302 includes a component that permits communication among the components of device 300. In some embodiments, processor 304 is implemented in hardware, software, or a combination of hardware and software. In some examples, processor 304 includes a processor (e.g., a central processing unit (CPU), a graphics processing unit (GPU), an accelerated processing unit (APU), and/or the like), a microphone, a digital signal processor (DSP), and/or any processing component (e.g., a field-programmable gate array (FPGA), an application specific integrated circuit (ASIC), and/or the like) that can be programmed to perform at least one function. Memory 306 includes random access memory (RAM), read-only memory (ROM), and/or another type of dynamic and/or static storage device (e.g., flash memory, magnetic memory, optical memory, and/or the like) that stores data and/or instructions for use by processor 304.

Storage component 308 stores data and/or software related to the operation and use of device 300. In some examples, storage component 308 includes a hard disk (e.g., a magnetic disk, an optical disk, a magneto-optic disk, a solid state disk, and/or the like), a compact disc (CD), a digital versatile disc (DVD), a floppy disk, a cartridge, a magnetic tape, a CD-ROM, RAM, PROM, EPROM, FLASH-EPROM, NV-RAM, and/or another type of computer readable medium, along with a corresponding drive.

Input interface 310 includes a component that permits device 300 to receive information, such as via user input (e.g., a touchscreen display, a keyboard, a keypad, a mouse, a button, a switch, a microphone, a camera, and/or the like). Additionally or alternatively, in some embodiments input interface 310 includes a sensor that senses information (e.g., a global positioning system (GPS) receiver, an accelerometer, a gyroscope, an actuator, and/or the like). Output interface 312 includes a component that provides output information from device 300 (e.g., a display, a speaker, one or more light-emitting diodes (LEDs), and/or the like).

In some embodiments, communication interface 314 includes a transceiver-like component (e.g., a transceiver, a separate receiver and transmitter, and/or the like) that permits device 300 to communicate with other devices via a wired connection, a wireless connection, or a combination of wired and wireless connections. In some examples, communication interface 314 permits device 300 to receive information from another device and/or provide information to another device. In some examples, communication interface 314 includes an Ethernet interface, an optical interface, a coaxial interface, an infrared interface, a radio frequency (RF) interface, a universal serial bus (USB) interface, a Wi-Fi® interface, a cellular network interface, and/or the like.

In some embodiments, device 300 performs one or more processes described herein. Device 300 performs these processes based on processor 304 executing software instructions stored by a computer-readable medium, such as memory 305 and/or storage component 308. A computer-readable medium (e.g., a non-transitory computer readable medium) is defined herein as a non-transitory memory device. A non-transitory memory device includes memory space located inside a single physical storage device or memory space spread across multiple physical storage devices.

In some embodiments, software instructions are read into memory 306 and/or storage device 308 from another computer-readable medium or from another device via communication interface 314. When executed, software instructions stored in memory 306 and/or storage device 308 cause processor 304 to perform one or more processes described herein. Additionally or alternatively, hardwired circuitry is used in place of or in combination with software instructions to perform one or more processes described herein. Thus, embodiments described herein are not limited to any specific combination of hardware circuitry and software unless explicitly stated otherwise.

Memory 306 and/or storage component 308 includes data storage or at least one data structure (e.g., a database and/or the like). Device 300 is capable of receiving information from, storing information in, communicating information to, or searching information stored in the data storage or the at least one data structure in memory 306 or storage device 308. In some examples, the information includes network data, input data, output data, or any combination thereof.

In some embodiments, device 300 is configured to execute software instructions that are either stored in memory 306 and/or in the memory of another device (e.g., another device that is the same as or similar to device 300). As used herein, the term "module" refers to at least one instruction stored in memory 306 and/or in the memory of another device that, when executed by processor 304 and/or by a processor of another device (e.g., another device that is the same as or similar to device 300) cause device 300 (e.g., at least one component of device 300) to perform one or more processes described herein. In some embodiments, a module is implemented in software, firmware, hardware, and/or the like.

The number and arrangement of components illustrated in FIG. 3 are provided as an example. In some embodiments, device 300 can include additional components, fewer components, different components, or differently arranged components than those illustrated in FIG. 3. Additionally or alternatively, a set of components (e.g., one or more components) of device 300 can perform one or more functions described as being performed by another component or another set of components of device 300.

Figure 4:
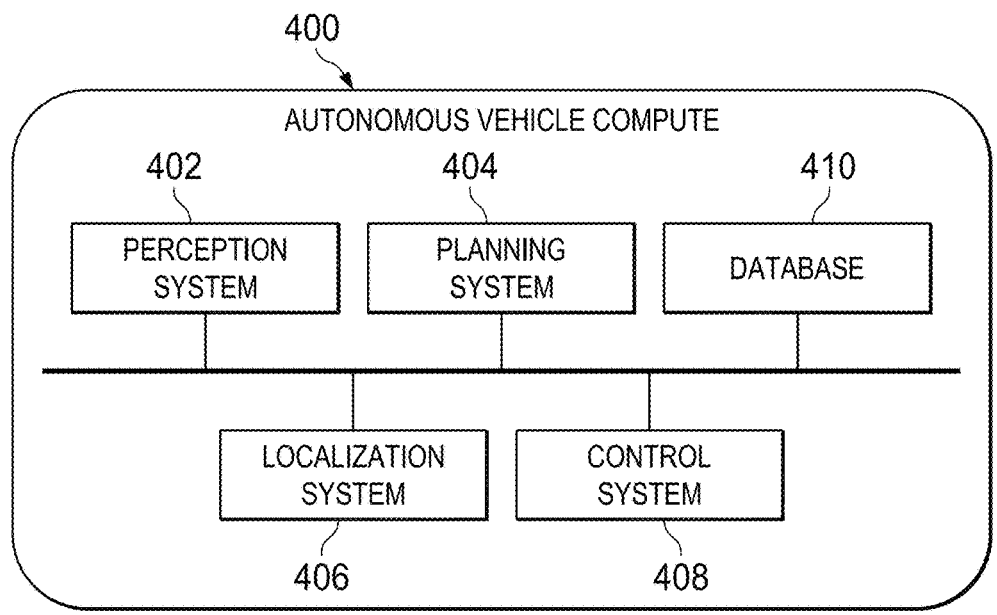
FIG. 4 is a diagram of certain components of an autonomous system.

Referring now to FIG. 4, illustrated is an example block diagram of an autonomous vehicle compute 400 (sometimes referred to as an "AV stack"). As illustrated, autonomous vehicle compute 400 includes perception system 402 (sometimes referred to as a perception module), planning system 404 (sometimes referred to as a planning module), localization system 406 (sometimes referred to as a localization module), control system 408 (sometimes referred to as a control module), and database 410. In some embodiments, perception system 402, planning system 404, localization system 406, control system 408, and database 410 are included and/or implemented in an autonomous navigation system of a vehicle (e.g., autonomous vehicle compute 202f of vehicle 200). Additionally, or alternatively, in some embodiments perception system 402, planning system 404, localization system 406, control system 408, and database 410 are included in one or more standalone systems (e.g., one or more systems that are the same as or similar to autonomous vehicle compute 400 and/or the like). In some examples, perception system 402, planning system 404, localization system 406, control system 408, and database 410 are included in one or more standalone systems that are located in a vehicle and/or at least one remote system as described herein. In some embodiments, any and/or all of the systems included in autonomous vehicle compute 400 are implemented in software (e.g., in software instructions stored in memory), computer hardware (e.g., by microprocessors, microcontrollers, application-specific integrated circuits [ASICs], Field Programmable Gate Arrays (FPGAs), and/or the like), or combinations of computer software and computer hardware. It will also be understood that, in some embodiments, autonomous vehicle compute 400 is configured to be in communication with a remote system (e.g., an autonomous vehicle system that is the same as or similar to remote AV system 114, a fleet management system 116 that is the same as or similar to fleet management system 116, a V2I system that is the same as or similar to V2I system 118, and/or the like).

In some embodiments, perception system 402 receives data associated with at least one physical object (e.g., data that is used by perception system 402 to detect the at least one physical object) in an environment and classifies the at least one physical object. In some examples, perception system 402 receives image data captured by at least one camera (e.g., cameras 202a), the image associated with (e.g., representing) one or more physical objects within a field of view of the at least one camera. In such an example, perception system 402 classifies at least one physical object based on one or more groupings of physical objects (e.g., bicycles, vehicles, traffic signs, pedestrians, and/or the like). In some embodiments, perception system 402 transmits data associated with the classification of the physical objects to planning system 404 based on perception system 402 classifying the physical objects.

In some embodiments, planning system 404 receives data associated with a destination and generates data associated with at least one route (e.g., routes 106) along which a vehicle (e.g., vehicles 102) can travel along toward a destination. In some embodiments, planning system 404 periodically or continuously receives data from perception system 402 (e.g., data associated with the classification of physical objects, described above) and planning system 404 updates the at least one trajectory or generates at least one different trajectory based on the data generated by perception system 402. In some embodiments, planning system 404 receives data associated with an updated position of a vehicle (e.g., vehicles 102) from localization system 406 and planning system 404 updates the at least one trajectory or generates at least one different trajectory based on the data generated by localization system 406.

In some embodiments, localization system 406 receives data associated with (e.g., representing) a location of a vehicle (e.g., vehicles 102) in an area. In some examples, localization system 406 receives LiDAR data associated with at least one point cloud generated by at least one LiDAR sensor (e.g., LiDAR sensors 202b). In certain examples, localization system 406 receives data associated with at least one point cloud from multiple LiDAR sensors and localization system 406 generates a combined point cloud based on each of the point clouds. In these examples, localization system 406 compares the at least one point cloud or the combined point cloud to two-dimensional (2D) and/or a three-dimensional (3D) map of the area stored in database 410. Localization system 406 then determines the position of the vehicle in the area based on localization system 406 comparing the at least one point cloud or the combined point cloud to the map. In some embodiments, the map includes a combined point cloud of the area generated prior to navigation of the vehicle. In some embodiments, maps include, without limitation, high-precision maps of the roadway geometric properties, maps describing road network connectivity properties, maps describing roadway physical properties (such as traffic speed, traffic volume, the number of vehicular and cyclist traffic lanes, lane width, lane traffic directions, or lane marker types and locations, or combinations thereof), and maps describing the spatial locations of road features such as crosswalks, traffic signs or other travel signals of various types. In some embodiments, the map is generated in real-time based on the data received by the perception system.

In another example, localization system 406 receives Global Navigation Satellite System (GNSS) data generated by a global positioning system (GPS) receiver. In some examples, localization system 406 receives GNSS data associated with the location of the vehicle in the area and localization system 406 determines a latitude and longitude of the vehicle in the area. In such an example, localization system 406 determines the position of the vehicle in the area based on the latitude and longitude of the vehicle. In some embodiments, localization system 406 generates data associated with the position of the vehicle. In some examples, localization system 406 generates data associated with the position of the vehicle based on localization system 406 determining the position of the vehicle. In such an example, the data associated with the position of the vehicle includes data associated with one or more semantic properties corresponding to the position of the vehicle.

In some embodiments, control system 408 receives data associated with at least one trajectory from planning system 404 and control system 408 controls operation of the vehicle. In some examples, control system 408 receives data associated with at least one trajectory from planning system 404 and control system 408 controls operation of the vehicle by generating and transmitting control signals to cause a powertrain control system (e.g., DBW system 202h, powertrain control system 204, and/or the like), a steering control system (e.g., steering control system 206), and/or a brake system (e.g., brake system 208) to operate. In an example, where a trajectory includes a left turn, control system 408 transmits a control signal to cause steering control system 206 to adjust a steering angle of vehicle 200, thereby causing vehicle 200 to turn left. Additionally, or alternatively, control system 408 generates and transmits control signals to cause other devices (e.g., headlights, turn signal, door locks, windshield wipers, and/or the like) of vehicle 200 to change states.

In some embodiments, perception system 402, planning system 404, localization system 406, and/or control system 408 implement at least one machine learning model (e.g., at least one multilayer perceptron (MLP), at least one convolutional neural network (CNN), at least one recurrent neural network (RNN), at least one auto-encoder, at least one transformer, and/or the like). In some examples, perception system 402, planning system 404, localization system 406, and/or control system 408 implement at least one machine learning model alone or in combination with one or more of the above-noted systems. In some examples, perception system 402, planning system 404, localization system 406, and/or control system 408 implement at least one machine learning model as part of a pipeline (e.g., a pipeline for identifying one or more objects located in an environment and/or the like).

Database 410 stores data that is transmitted to, received from, and/or updated by perception system 402, planning system 404, localization system 406 and/or control system 408. In some examples, database 410 includes a storage component (e.g., a storage component that is the same as or similar to storage component 308 of FIG. 3) that stores data and/or software related to the operation and uses at least one system of autonomous vehicle compute 400. In some embodiments, database 410 stores data associated with 2D and/or 3D maps of at least one area. In some examples, database 410 stores data associated with 2D and/or 3D maps of a portion of a city, multiple portions of multiple cities, multiple cities, a county, a state, a State (e.g., a country), and/or the like). In such an example, a vehicle (e.g., a vehicle that is the same as or similar to vehicles 102 and/or vehicle 200) can drive along one or more drivable regions (e.g., single-lane roads, multi-lane roads, highways, back roads, off road trails, and/or the like) and cause at least one LiDAR sensor (e.g., a LiDAR sensor that is the same as or similar to LiDAR sensors 202b) to generate data associated with an image representing the objects included in a field of view of the at least one LiDAR sensor.

In some embodiments, database 410 can be implemented across a plurality of devices. In some examples, database 410 is included in a vehicle (e.g., a vehicle that is the same as or similar to vehicles 102 and/or vehicle 200), an autonomous vehicle system (e.g., an autonomous vehicle system that is the same as or similar to remote AV system 114, a fleet management system (e.g., a fleet management system that is the same as or similar to fleet management system 116 of FIG. 1, a V2I system (e.g., a V2I system that is the same as or similar to V2I system 118 of FIG. 1) and/or the like.

Figure 5:
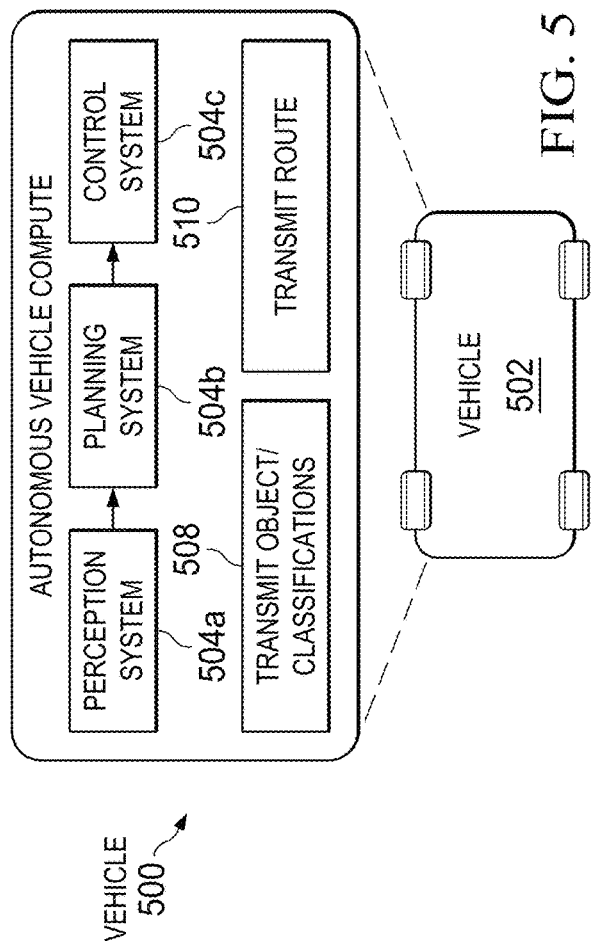
FIG. 5 is a diagram of an example of an implementation of a process for low level fusion.

Referring now to FIG. 5, illustrated is a diagram of an implementation 500 of a process for low level fusion. In some embodiments, implementation 500 includes a perception system 504a, planning system 504b, and control system 504c. In some embodiments, perception system 504a is the same as or similar to system 402 of FIG. 4. In some embodiments, planning system 504b is the same as or similar to planning system 404 of FIG. 4. In some embodiments, control system 504c is the same as or similar to control system 408 of FIG. 4.

The perception system 504a may capture data in an environment of the vehicle 502 using hardware of the vehicle 502. In examples, the vehicle hardware includes devices that capture information that is processed to identify objects in the environment (e.g., LiDAR sensors 202b of FIG. 2; LiDAR system 602 of FIG. 6). The objects may be classified, where the objects are grouped into types such as pedestrian, bicycle, automobile, traffic sign, etc. The captured information may also be used to generate a scene description associated with the surrounding environment. The perception system 504a can continuously or periodically transmit object classifications 508 and other data to the planning system 504b. The smart LiDAR as used herein enables object classification with a greater level of accuracy when compared to conventional techniques. The planning system 504b uses data from the perception system 504a, among other things, to generate a route. The route is transmitted (510) to a control system 504c. The control system 504c causes the vehicle to navigate the route generated by the planning system 504b.

Figure 6:
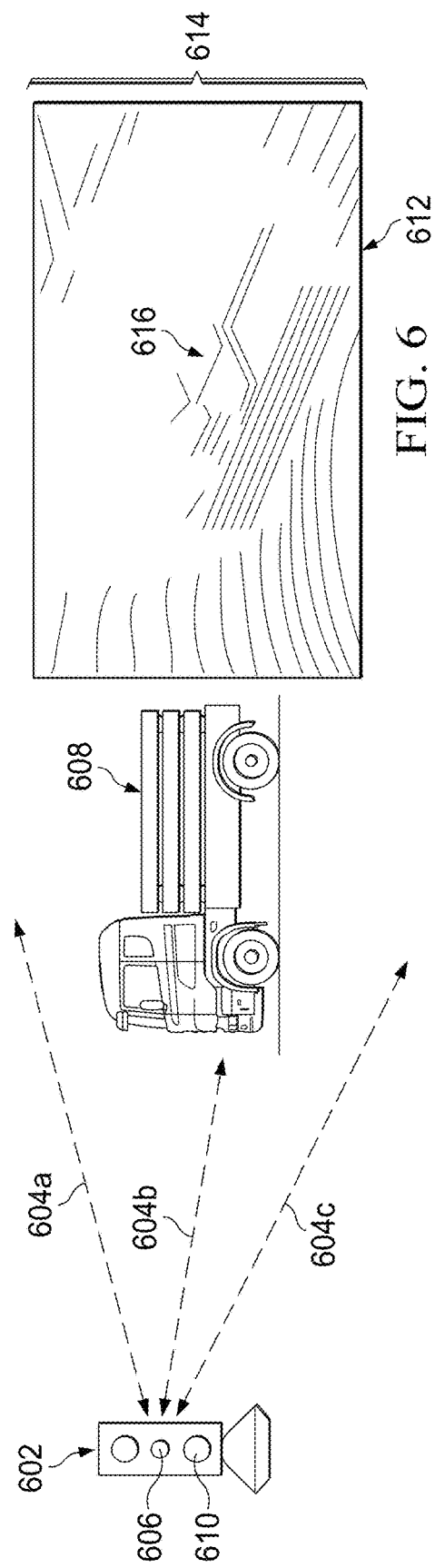
FIG. 6 shows an example of a Light Detection and Ranging (LiDAR) system.

FIG. 6 shows an example of a LiDAR system 602. The LiDAR system 602 emits light 604a-c from one or more light emitters 606 (e.g., laser transmitter). Light emitted by a LiDAR system is typically not in the visible spectrum; for example, infrared light is often used. Some of the light 604b emitted encounters a physical object 608 (e.g., a vehicle) and reflects back to the LiDAR system 602. The LiDAR system 602 also has one or more light detectors 610 (e.g., photodiode, pin photodiode, APD, SPAD, and SiPM), which detect the reflected light. In an embodiment, one or more data processing systems associated with the LiDAR system generates an image 612 representing the field of view 614 of the LiDAR system. The image 612 includes information that represents the boundaries and reflectivity 616 of a physical object 608. In this way, the image 612 is used to determine the boundaries 616 of one or more physical objects near an AV.

Figure 7:
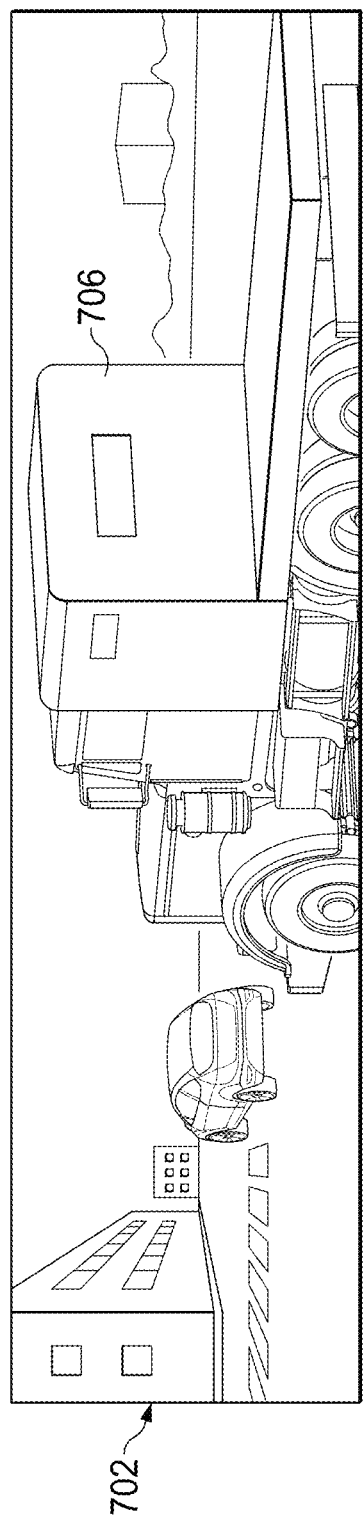
FIG. 7 shows the LiDAR system in operation.

FIG. 7 shows the LiDAR system 602 in operation. In the example of FIG. 7, the vehicle 102 receives both camera system output in the form of an image 702 and LiDAR system output in the form of LiDAR data points 704. In use, the data processing systems of the vehicle 102 compare the image 702 to the data points 704. In particular, a physical object 706 identified in the image 702 is also identified among the data points 704. In this way, the vehicle 102 perceives the boundaries of the physical object based on the contour and density of the data points 704.

Figure 8:
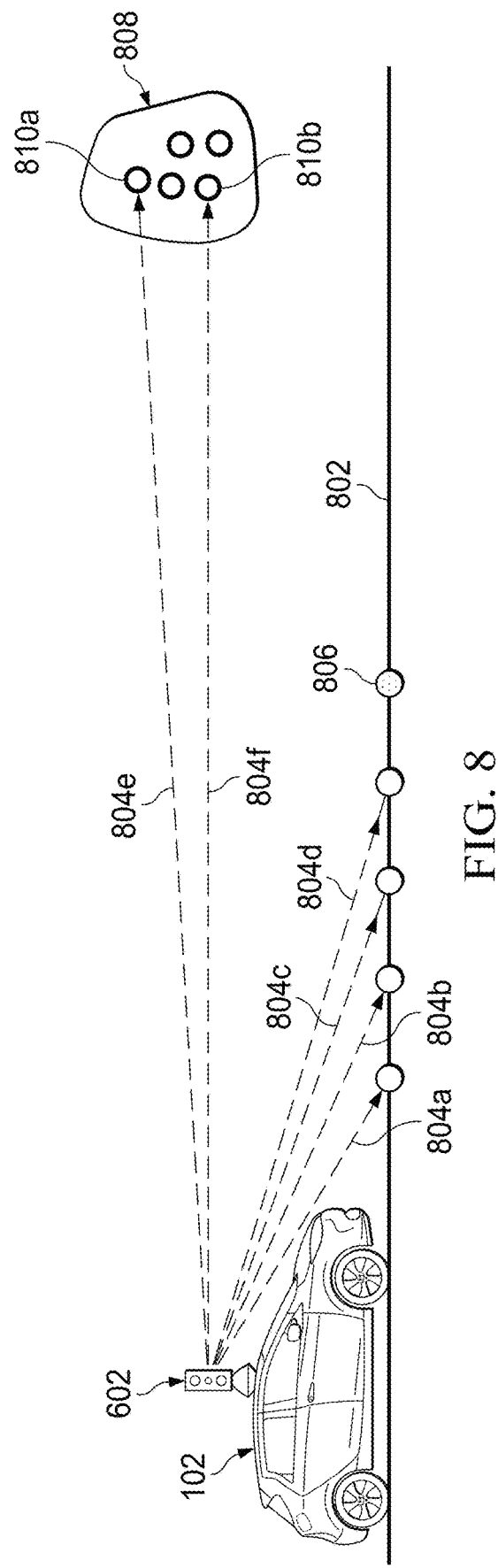
FIG. 8 shows the operation of the LiDAR system in additional detail.

FIG. 8 shows the operation of the LiDAR system 602 in additional detail. As described above, the vehicle 102 detects the boundary and reflectivity of a physical object based on characteristics of the data points detected by the LiDAR system 602. As shown in FIG. 8, a flat object, such as the ground 802, will reflect light 804a-d emitted from a LiDAR system 602 in a consistent manner. As the vehicle 102 travels over the ground 802, the LiDAR system 602 will continue to detect light reflected by the next valid ground point 806 if nothing is obstructing the road. However, if an object 808 obstructs the road, light 804e-f emitted by the LiDAR system 602 will be reflected from points 810a-b in a manner inconsistent with the expected consistent manner. From this information, the vehicle 102 can determine that the object 808 is present.

In an embodiment, the SiPM is an array of SPADs. Generally, a SPAD is able to detect single photons providing short duration trigger pulses that can be counted. However, they can also be used to obtain the time of arrival of the incident photon due to the high speed that the avalanche builds up and the device's low timing jitter. A SPAD is biased well above its reverse-bias breakdown voltage and has a structure that enables operation without damage or undue noise. Generally, a photodiode operated in Geiger mode employs a mechanism of breakdown to achieve a high gain and is referred to as a SPAD.

Generally, the reflections observed by the SiPM microcells (e.g., SPAD) are summed to generate an output signal. An internal and/or external circuit calculates the optical power and the arrival time of the reflected light by measuring the current signal (e.g., measuring the time of the rising edge, peak, area, and shape of the signal). For example, timing calculations can be based on edge, peak, and shape of the signal, and power calculations can be based on peak, area, and shape of the signal. In an embodiment, an output circuit counts the number of fired microcells (e.g., active SiPM device). In an embodiment, the output circuit measures the start time of the pulse output by the microcells to obtain the arrival time of the photon. Generally, the SiPM dynamic range is potentially limited by the number of microcells (SPAD) in each SiPM pixel, which fundamentally limit the intensity/reflectivity accuracy.

Figure 9:
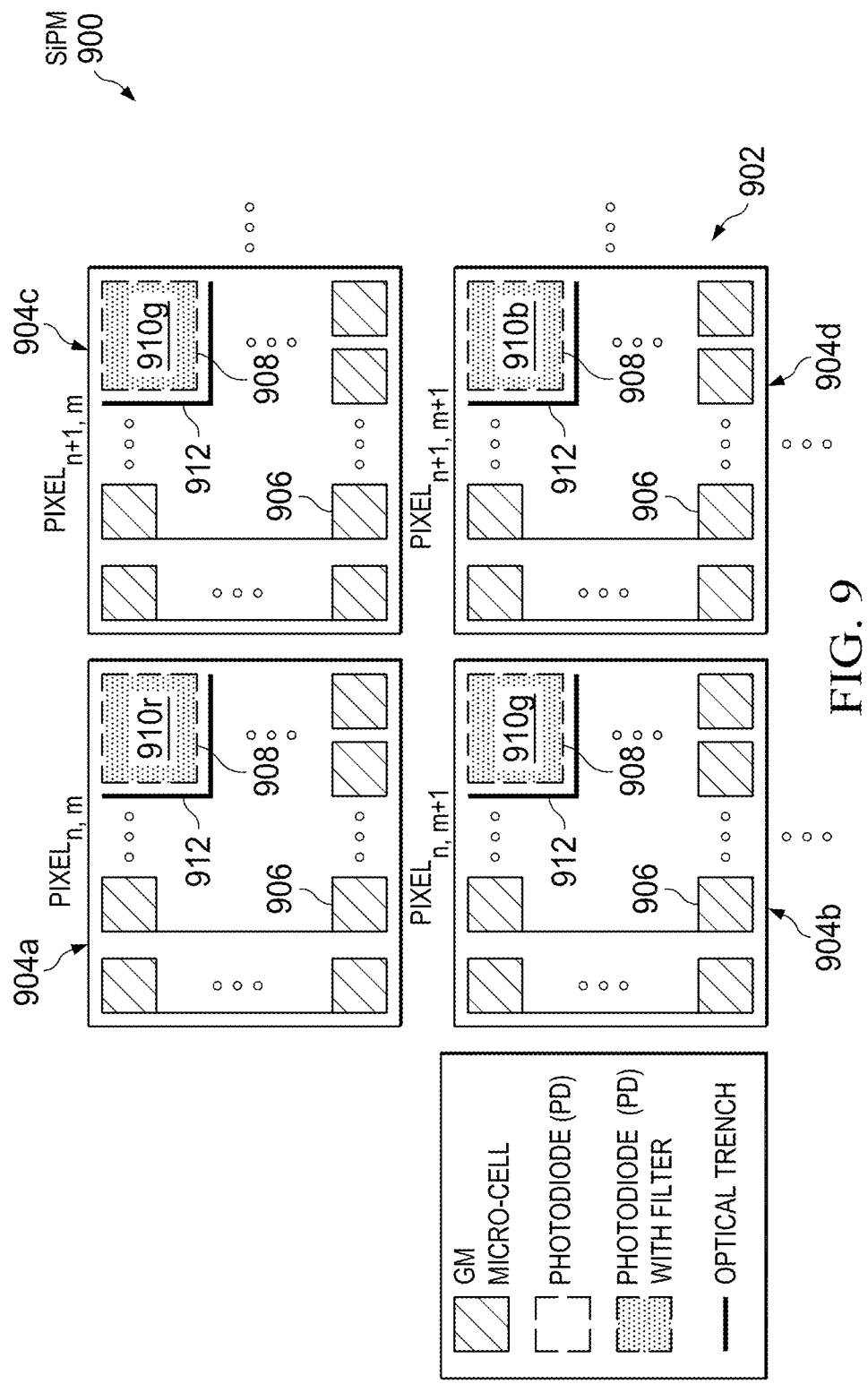
FIG. 9 is a diagram of a pixel arrangement of a pixel arrangement on an SiPM-based sensor.

FIG. 9 is a diagram of a pixel arrangement 902 on an SiPM-based sensor 900. Pixels 904a-904d depicted on the pixel arrangement 902 are four pixels (e.g., in an adjacent 2×2 block of cells) of the overall pixel arrangement 902 with dimensions at least as large as n by m. Specifically, the pixels 904a-904d include a pixel (n, m) 904a, a pixel (n, m+1) 904b, a pixel (n+1, m) 904c, and a pixel (n+1, m+1) 904d.

Each of the pixels 904a-904d includes one or more regions of each of Geiger-Mode (GM) micro-cells 906, photodiodes 908 with optical filters 910, and optical trenches 912.

In some embodiments, the SiPM-based sensor 900 operates by read outs both the photodiodes 908 and the GM micro-cells 906 to produce dual output signal. In this way, two separate anodes are simultaneously output. In some embodiments, the output of the SiPM-based sensor 900 is a continuous analog output (e.g., current output). In this manner, the SiPM-based sensor 900 operates as an analog device while the current output of the plurality of pixels of the SiPM being read in parallel. In some embodiments, the output of the SiPM-based sensor 900 is individual pulses that are distinguishable and thus can be counted (e.g., digital output). The pulses output by the SiPM are counted to generate an output signal. The output of the SiPM-based sensor 900 according to the present techniques enables the generation of signals within a dynamic range from a single photon to hundreds and thousands of photons detected by the GM micro-cells 906 and the photodiodes 908. Typically, GM micro-cells 906 and 908 could have different optical filters, e.g., photodiodes 908 with an RGB filter and GM micro-cells 906 with a near-infrared (NIR) filter. When GM micro-cells 906 and photodiodes 908 have a same optical filter, e.g., NIR filter with same or different transmission characteristics, photodiode 908 output signals would help to increase dynamic range.

In examples, one or more SiPM based pixels 904 of the SiPM-based sensor 900 is a series combination of a GM micro-cell 906 and a photodiode with optical filter 910. SiPM-based sensor 900 is a photodetector that senses, times, and quantifies light (or optical) signals down to the single-photon level. Generally, an SiPM pixel 904 includes a number of microcells in an array that share the common output (e.g., anode and cathode). In an embodiment, each microcell is a series combination of a single photon avalanche photodiode (SPAD) and a quenching circuit (e.g., resistor). All of the microcells are connected in parallel and detects photons independently, and the resulting an SiPM-based sensor 900 has a plurality of pixels 904, some with multiple anodes. In some embodiments, SiPM-based sensor 900 can include one or multiple SiPM-based pixels 904 which can detect photon or optical return signals independently. Each pixel 904 can include a number of GM micro-cells 906 (e.g., SPAD) and one (typically) or more photodiode 908 sub-regions.

In operation during a low flux event, when a photon is detected by a microcell, an electron hole pair is created. When a sufficiently high electric field is generated within the depletion region, the charge carrier (electron or hole) created is accelerated to carry sufficient kinetic energy to create secondary electron-hole pairs (impact ionization). A macroscopic (avalanche) current passes through the microcell until the microcell is quenched by passive quenching (e.g., the quenching resistor) or active circuitry. The sum of the currents from each of fired microcell is combined to form a pseudo-analog output (a chronological superposition of current pulses of fired microcells) that is used to calculate the magnitude of a photon flux. Quenching lowers a reverse voltage applied to the SiPM to a value below its breakdown voltage, thus halting the avalanche of current. The SiPM then recharges back to a bias voltage, and is available to detect subsequent photons.

In an embodiment, the photodiodes 908 with optical filters 910 are each configured to perform filtering so as to be receptive to one of the RGB colors (e.g., similar to an imaging sensor). In the arrangement of photodiodes 908 with optical filters 910 depicted in FIG. 9, photodiode 908 with optical filter 910r is configured to receive red light, photodiodes 908 with optical filter 910g are configured to receive green light, and photodiode 910b is configured to receive blue light. The optical trenches 912 segregate the photodiodes 908 from other photo-sensitive regions (e.g., SPAD 906) in each of the pixels 904a-904d. In an embodiment, the optical trenches 912 are optional.

Figure 10:
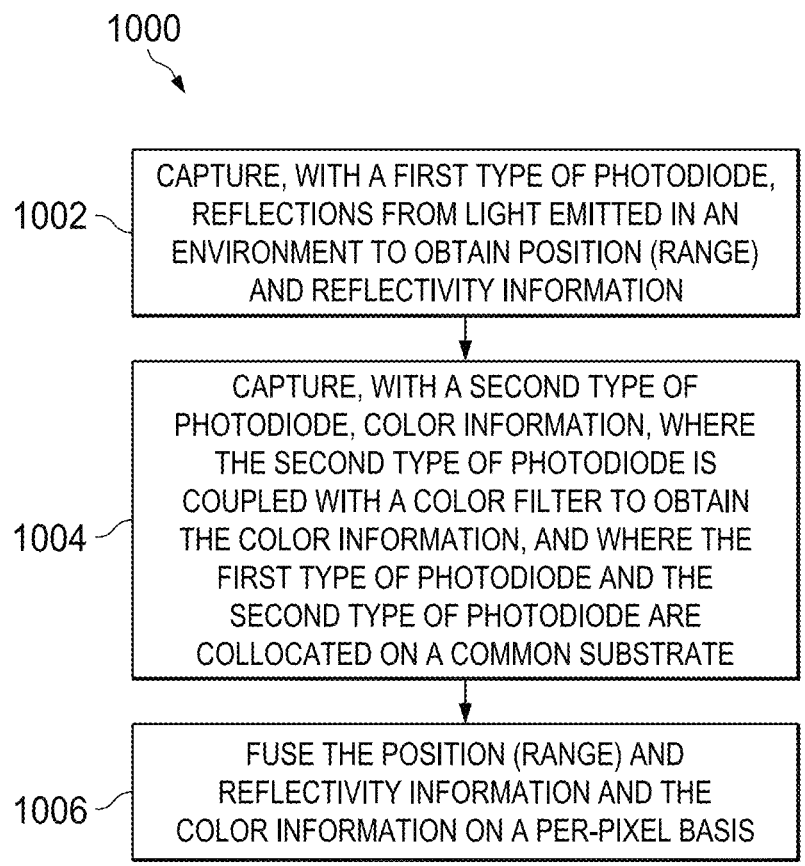
FIG. 10 is a flowchart of a process for fusing reflectivity and color information captured from first and second type of photodiodes, respectively.

The application of sub-region of photodiode with RGB filters to each (or some) SiPM pixel enables capture of camera-like data simultaneously with point cloud data using the same hardware (e.g., in a process described for FIG. 10). Since techniques of the present disclosure capture both point cloud and camera-type data simultaneously, the calibration process is changed. For example, capturing multiple types of data using a single sensor can streamline calibration.

Traditionally, calibration between point 3D cloud type data and 2D camera data is performed to generate a correspondence between data output by separate hardware sensors. For example, traditional calibration often uses one or more transformations that are used to fuse the data. Generally, data fusion enables accurate interpretation of objects in the environment. An SiPM sensor according to the present techniques includes hardware that captures point cloud data to be co-located on a same substrate with hardware that captures 2D imaging data. By being co-located on the same substrate, one or more transformations used to fuse the multiple data types output by the SiPM device is eliminated. In particular, the transformation that maps points from a LiDAR coordinate system to a camera coordinate system is known based on, at least in part, intrinsic parameters that characterize the SiPM based sensor.

In an example, a pixel of a sensor according to the present techniques includes a first type of photodiode (e.g., GM micro-cells 906 with internal gain) and a second type of photodiode (e.g., photodiodes 908 with optical filters 910). The second type of photodiode can have a different internal gain (e.g., PD, PIN PD, or APD). The first and second type of photodiodes capture light emitted in the environment. Data captured by the first type of photodiode is output by the sensor and is processed to generate 3D position (e.g., range data) and reflectivity data. In examples, 3D position and reflectivity data may be point cloud data. In some cases, the second type of photodiode is physically coupled with a color filter (e.g., visible or NIR). For example, the color filter is an RGB filter that removes other colors in a reflection while allowing a predetermined color to pass, enabling the corresponding photodiode to capture color information. The color filter is realized using an array of filters in a predefined pattern atop one or more photodiodes. Data captured by the second type of photodiodes coupled with a color filter is output by the sensor and is processed to generate 2D image data. The position information and 2D color image information are fused on a per-pixel basis, prior to read-out by external circuitry. In this manner, the present techniques enable low-level data fusion, on a per-pixel basis, prior to outputting the sensor data.

The photodiode 908 with optical filters 910 can introduce noise and/or optical crosstalk. For example, noise and/or optical crosstalk can include interactions between photodiode 908 and microcells 906 introduced by photon and electron leakages caused by optical refraction and minority carriers. In an embodiment, trenches manufactured into the substrate can mitigate the noise and/or crosstalk between sub-pixels. For example, trenches (e.g., optical trenches 912) can be implemented as non-luminescence areas between adjacent sub-pixels.

Referring now to FIG. 10, a process 1000 is described for fusing 3D position and 2D image information captured from first and second type of photodiodes, respectively. In some embodiments, one or more of the steps described with respect to process 1000 are performed (e.g., completely, partially, and/or the like) by autonomous system 202. Additionally, or alternatively, in some embodiments, one or more steps described with respect to process 1000 are performed (e.g., completely, partially, and/or the like) by another device or group of devices separate from or including device 300. The first type of photodiode (e.g., a sub-region of the SPAD array) can provide both 3D position (range) and reflectivity information. Using the first type of photodiode (e.g., GM micro-cells 906) and a second type of photodiode (e.g., photodiodes 908 with filters 910). The 3D position, reflectivity, and 2D image can be fused on per pixel basis.

At 1002, reflections (e.g., captured information) are captured with a first type of photodiode (e.g., GM micro-cell 906) from light emitted in an environment (e.g., environment 100 of FIG. 1) to obtain position and reflectivity information. For example, the perception system 504*a* may capture information in an environment of the vehicle 502 using hardware of the vehicle 502. In some examples, the captured information can include information related to objects grouped into types, such as pedestrians, bicycles, automobiles, traffic signs, and so on. The captured information can include reflections such as the reflected light 804*a-d* emitted from the LiDAR system 602. In these examples, the reflected light can be light 804*e-f* emitted by the LiDAR system 602 toward object 808 and reflected from points 810*a-b*. In some embodiments, the first type of photodiode is a single photon avalanche diode (SPAD).

At 1004, color information is captured with a second type of photodiode (e.g., photodiodes 908 with optical filters 910). The second type of photodiode is coupled with a color filter to obtain the color information (e.g., from photodiode with optical filter 910*r* configured to receive red light, photodiodes with optical filter 910*g* configured to receive green light, and photodiode with optical filter 910*b* configured to receive blue light). The first type of photodiode and the second type of photodiode are collocated on a common substrate, e.g., SiPM-based sensor 900). In some embodiments, the second type of photodiode (or photodetector) is a photodiode (PD) or PIN photodiode (PIN).

At 1006, the range (3D position) information and the color (2D image) information are fused on a per-pixel basis (e.g., by the perception system 504*a*). For example, the range and reflectivity data and the image data can be fused by the SiPM-based sensor 900 before being processed by the perception system 504*a*.

In some embodiments, process 1000 further includes applying a deep trench pattern (e.g., an optical trench) to the common substrate such that crosstalk between the second type photodiode to the first type of photodiode is reduced. For example, optical trenches 912 can be built into the SiPM-based sensor 900 to prevent crosstalk between the GM micro-cells 906 and the photodiodes 908 with optical filters 910.

In some embodiments, the fused position and reflectivity information and the color information is provided to control system of an autonomous vehicle. For example, the SiPM-based sensor 900 can be accessed directly by the control system 504*c*.

In the foregoing description, aspects and embodiments of the present disclosure have been described with reference to numerous specific details that can vary from implementation to implementation. Accordingly, the description and drawings are to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction. Any definitions expressly set forth herein for terms contained in such claims shall govern the meaning of such terms as used in the claims. In addition, when we use the term "further comprising," in the foregoing description or following claims, what follows this phrase can be an additional step or entity, or a sub-step/sub-entity of a previously-recited step or entity.

What is claimed is:

1. A sensor device, comprising:
a plurality of pixels, wherein the plurality of pixels are connected in parallel, wherein each pixel includes one or more regions of each of Geiger-Mode (GM) micro-cells, photodiodes, optical filters, and a deep trench pattern, and wherein at least one pixel of the plurality of pixels comprises:
a first type of photodiode, wherein the first type of photodiode captures reflections from light emitted in an environment and outputs a three-dimensional (3D) position and reflectivity information; and
a second type of photodiode with filters, wherein the second type of photodiode captures filtered reflections in the environment, wherein a color filter separates data in the filtered reflections into color information output by the second type of photodiode, and wherein the first type of photodiode and the second type of photodiode are collocated on a common substrate;
wherein the 3D position and reflectivity information and the color information of the at least one pixel of the plurality of pixels are fused and output by the sensor.

2. The sensor device of claim 1, wherein the first type of photodiode is one or more single photon avalanche diode (SPADs) with internal gain.

3. The sensor device of claim 1, wherein the second type of photodiode is a photodiode with a second internal gain.

4. The sensor device of claim 1, wherein the deep trench pattern is applied to the common substrate such that crosstalk between the second type of photodiode to the first type of photodiode is reduced.

5. The sensor device of claim 1, wherein the position and reflectivity information and image data captured by the first type of photodiode and the second type of photodiode are fused prior to processing by external circuitry.

6. The sensor device of claim 1, wherein the sensor device is part of an autonomous vehicle system.

7. The sensor device of claim 1, wherein the sensor device outputs one or both of the first type of photodiode and the second type of photodiode to produce a continuous output signal.

8. The sensor device of claim 1, wherein the color filter is a red/green/blue (RGB) filter with a visible light range typically between 400 nanometers (nm) and 700 nm or a near-infrared (NIR) filter with a visible light range typically between 700 nm and 2 micrometers (μm).

9. The sensor device of claim 8, wherein the NIR filter has same or different optical characteristics as a SPAD region, wherein the optical characteristics include at least transmission bandwidth and attenuation factor.

10. A method, comprising:
- capturing, with a first type of photodiode, reflections from light emitted in an environment to obtain position and reflectivity information;
- capturing, with a second type of photodiode, color information, wherein the second type of photodiode is coupled with a color filter to obtain the color information, and wherein the first type of photodiode and the second type of photodiode are collocated on a common substrate including a plurality of pixels connected in parallel, wherein each pixel includes one or more regions of each of Geiger-Mode (GM) micro-cells, photodiodes, optical filters, and a deep trench pattern; and
- fusing the position and reflectivity information and the color information on a per-pixel basis.

11. The method of claim 10, wherein the first type of photodiode is one of more single photon avalanche diodes (SPADs) with internal gain.

12. The method of claim 10, wherein the second type of photodiode is an photodiode with second internal gain.

13. The method of claim 10, further comprising applying the deep trench pattern to the common substrate such that crosstalk between the second type of photodiode to the first type of photodiode is reduced.

14. The method of claim 10, further comprising fusing the position and reflectivity information and image data captured with the first type of photodiode and the second type of photodiode prior to processing by external circuitry.

15. The method of claim 10, further comprising providing the fused position and reflectivity information and the color information to a control system of an autonomous vehicle.

16. The method of claim 10, further comprising outputting one or both of the first type of photodiode and the second type of photodiode to produce a continuous output signal.

17. A non-transitory, computer-readable storage medium having stored thereon instructions that, when executed by one or more processors, cause the one or more processors to perform operations comprising:
- capturing, with a first type of photodiode, reflections from light emitted in an environment to obtain position and reflectivity information;
- capturing, with a second type of photodiode, color information, wherein the second type of photodiode is coupled with a color filter to obtain the color information, and wherein the first type of photodiode and the second type of photodiode are collocated on a common substrate including a plurality of pixels connected in parallel, wherein each pixel includes one or more regions of each of Geiger-Mode (GM) micro-cells, photodiodes, optical filters, and a deep trench pattern; and
- fusing the position and reflectivity information and the color information on a per-pixel basis.

18. The non-transitory, computer-readable storage medium of claim 17, wherein the first type of photodiode is one of more single photon avalanche diodes (SPADs) with internal gain.

19. The non-transitory, computer-readable storage medium of claim 17, wherein the second type of photodiode is an photodiode with second internal gain.

20. The non-transitory, computer-readable storage medium of claim 17, the operations further comprising applying the deep trench pattern to the common substrate such that crosstalk between the second type of photodiode to the first type of photodiode is reduced.

21. A sensor device, comprising:
- a plurality of pixels, wherein the plurality of pixels are connected in parallel, wherein each pixel includes one or more regions of each of Geiger-Mode (GM) micro-cells, photodiodes, optical filters, and a deep trench pattern, and wherein at least one pixel of the plurality of pixels comprises:
  - a first type of photodiode, wherein the first type of photodiode captures reflections from light emitted in an environment and outputs a three-dimensional (3D) position and reflectivity information; and
  - a second type of photodiode with filters, wherein the second type of photodiode captures filtered reflections in the environment, wherein a color filter separates data in the filtered reflections into color information output by the second type of photodiode, and wherein the first type of photodiode and the second type of photodiode are collocated on a common substrate;
- wherein the 3D position and reflectivity information and the color information of the at least one pixel of the plurality of pixels are fused and output by the sensor;
- and wherein the first type of photodiode and the second type of photodiode produce a dual output signal of individual pulses that are distinguishable and countable.

* * * * *